United States Patent [19]

Gleason et al.

[11] Patent Number: 4,849,689

[45] Date of Patent: Jul. 18, 1989

[54] MICROWAVE WAFER PROBE HAVING REPLACEABLE PROBE TIP

[75] Inventors: K. Reed Gleason, Portland; Keith E. Jones, Beaverton; Eric W. Strid, Portland, all of Oreg.

[73] Assignee: Cascade Microtech, Inc., Beaverton, Oreg.

[21] Appl. No.: 267,397

[22] Filed: Nov. 4, 1988

[51] Int. Cl.[4] .................... G01R 31/00; H01P 3/08
[52] U.S. Cl. .................... 324/158 P; 324/158 F; 324/73 PC; 333/246
[58] Field of Search ........... 324/158 F, 158 P, 73 PC, 324/72.5, 45; 333/246; 439/482

[56] References Cited

U.S. PATENT DOCUMENTS 4,697,143  9/1987  Lockwood et al. ............ 324/158 F
4,764,723  8/1988  Strid ........................... 324/158 F

OTHER PUBLICATIONS

C. Barsotti et al, "New Probe Cards Replace Needle Types"; Semiconductor International; Aug. 1988; pp. 98-101.
Cascade Microtech, Inc., "Wide Probe Assembly"; Drawing No. 500-0007-00; May 29, 1986.
Bailey et al; "A Neutron Hardness Assurance Based on High Frequency Probe Measurements"; IEEE Transaction On Nuclear Science, vol. NS-23, No. 6, Dec. 1976; pp. 2020-2023.

Primary Examiner—Reinhard J. Eisenzopf
Assistant Examiner—Vinh P. Nguyen
Attorney, Agent, or Firm—Chernoff, Vilhauer, McClung & Stenzel

[57] ABSTRACT

A microwave wafer probe having a replaceable planar transmission line probe tip which detachably connects to a planar transmission line circuit board within the probe head. The circuit board may include passive and/or active electrical circuit components interconnecting its conductors which, due to the detachable interconnection with the probe tip, do not have to be replaced if the probe tip should be damaged. The detachable interconnection between the probe tip and the circuit board is tolerant to misalignment of the two elements because the interconnected end portions of the respective conductors are shaped so as to maintain the impedance between the two elements substantially constant despite misalignment. Preferably, both the circuit board and the detachable tip include coplanar transmission lines interconnected by compressing the overlapping end portions of their conductors together.

12 Claims, 3 Drawing Sheets

MICROWAVE WAFER PROBE HAVING REPLACEABLE PROBE TIP

BACKGROUND OF THE INVENTION

The present invention relates to microwave wafer probes, and particularly to such probes having replaceable probe tips.

Microwave wafer probes are well known to the art as exemplified by probe cards marketed by Tektronix Inc. of Beaverton, Oreg., and by cantilevered probes marketed by Cascade Microtech, Inc. of Beaverton, Oreg. and shown in U.S. Pat. No. 4,697,143. Most existing wafer probes have nonreplaceable transmission line probe tips permanently connected to connector assemblies which in turn detachably connect to external transmission lines linked to test equipment. However, wafer probes having cantilevered tips which are detachably connected to such connector assemblies are also known, thereby enabling replacement of a damaged or worn probe tip without replacing the entire probe head. Prior examples of replaceable probe tips include a coplanar probe tip detachably interconnected with a coaxial connector assembly in a probe marketed by Design Technique International, Inc. of Chatsworth, Calif. Also, Cascade Microtech, Inc. of Beaverton, Oreg. has previously marketed a wide probe having a coplanar probe tip detachably connected to a microstrip "fanout" assembly which in turn is connected to multiple coaxial connectors, as shown in U.S. Pat. No. 4,764,723.

It is often desirable that the wafer probe be equipped with passive electrical circuit components such as capacitors, and/or active components such as amplifiers, to accomplish predetermined probing functions. Such components have previously been mounted directly on probe tips of either the permanent or replaceable type. Unfortunately, in either case, damage or wear to the probe tip requires replacement not only of the tip but of these expensive circuit components as well. This cost cannot feasibly be avoided by placing the components in a remote location relative to the probe tip because such location results in undesirable phase shifts and signal losses.

Accordingly, what is needed is a probe tip system which makes it possible to replace a damaged or worn probe tip economically without requiring replacement of the aforementioned passive or active electrical circuit components, while compatibly enabling the circuit components to be connected in very close proximity to the probe tip.

SUMMARY OF THE INVENTION

The present invention satisfies the above-identified need by interposing a planar controlled-impedance transmission line circuit board, which includes the above-mentioned components or to which the components are closely connected, operatively between the probe's external connector assembly and a replaceable, planar, controlled-impedance transmission line probe tip. Preferably, both the circuit board and the probe tip comprise respective coplanar transmission lines, or waveguides, which may be detachably joined together by an overlapping interconnection which is secured by a selectively releasable compression member holding the overlapping portions of the two elements forcibly together. Alternatively, the probe tip and/or circuit board could employ multiplanar printed transmission lines such as microstrip or stripline structures.

A significant problem to be overcome with such a replaceable planar transmission line probe tip is the problem of misalignment of the tip with the circuit board. Any variations in alignment of two transmission lines causes variations in the characteristic impedance of their interface, preventing a constant characteristic impedance and causing undesirable reflections and distortions of high-frequency signals. In the present invention, this problem is solved preferably by providing overlapping end portions of the corresponding conductors of the circuit board and probe tip which are shaped to permit variations in transverse and/or longitudinal alignment without causing substantial changes in the characteristic impedance of the interface.

Another problem to be overcome is the reduction in length of a planar probe tip necessary to interpose a transmission line circuit board between the tip and the external connector. Even though the tip's dielectric substrate is resilient, the shortened length adds stiffness to the tip making it less likely to conform its plane to that of the device under test when contact is made, thus risking insufficient contact with some of the pins of the device. In the present invention this problem is solved by making the tip's substrate of a different rigidity than that of the circuit board's substrate, and/or by providing a resilient compressive member at the extremity of the tip to forcibly conform the tip's plane to that of the device under test.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 6 is an enlarged side view of the forward extremity of the probe tip in contact with a device under test.

DESCRIPTION OF THE PREFERRED EMBODIMENT

Figure 1:
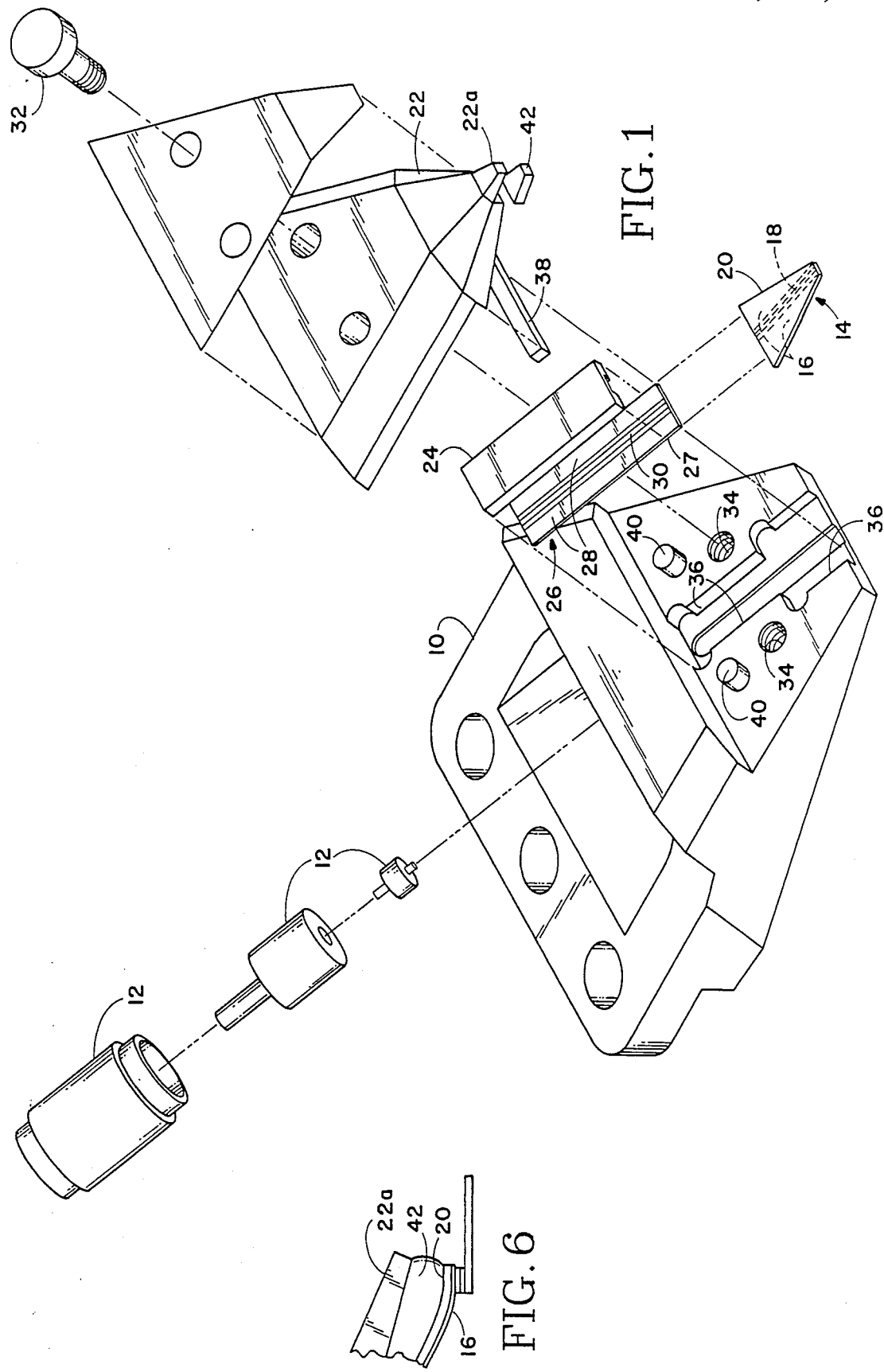
FIG. 1 is an exploded perspective view of an exemplary embodiment of a wafer probe constructed in accordance with the present invention.

With reference to FIG. 1, an exemplary embodiment of the wafer probe of the present invention comprises a probe body 10 having a connector assembly 12 mounted thereon for connecting the probe, by an external coaxial cable or other type of external transmission line (not shown), to appropriate testing equipment such as a network analyzer (not shown). A coplanar transmission line probe tip 14 of trapezoidal shape is provided for temporarily contacting a device under test by means of downwardly facing ground lines 16 and a central signal line 18 mounted on a resilient substrate 20 of a suitable dielectric material such as Kaptonp198. Microwave absorbers 22 and 24 are preferably provided to absorb energy propagating along the probe ground lines, although absorber 24 may be deleted to provide space for electrical circuit components. In the foregoing respects, the probe is similar in principle to that disclosed in U.S. Pat. No. 4,697,143, which is incorporated herein by reference.

The salient difference between the present invention and that disclosed in the above-mentioned patent is the presence of a coplanar transmission line circuit board 26, interconnected operatively between the connector assembly 12 and the probe tip 14, having upwardly facing coplanar ground lines 28 and a central signal line 30 mounted on a dielectric substrate 27. These lines join in a longitudinally overlapping connection with the overlying, downwardly facing, coplanar ground lines 16 and signal line 18 of the probe tip 14. Such interconnection is an easily detachable one by virtue of the fact that the overlapping portions of the probe tip 14 and circuit board 26 are clamped together between the probe body 10 and tip absorber 22 by a suitable releasable structure such as a pair of screws 32 (only one of which is shown) engaging threaded sockets 34 in the probe body 10 when the circuit board 26 and probe tip 14 are matingly nested in overlapping alignment within a receptacle 36 in the probe body 10. A resilient Poron TM or other suitable dielectric compressor bar 38 ensures a tight compressive electrical contact between the overlapping portions of the probe tip and circuit board when the screws 32 are tightened. Studs 40 protruding from the probe body are insertable in mating sockets (not shown) in the bottom of the tip absorber 22 for alignment purposes. The opposite end of the circuit board 26 is either permanently or detachably connected to the coaxial connector assembly 12 in a conventional manner.

The dielectric substrate 20 of the probe tip is preferably less rigid than the substrate 27 of the circuit board in order to preserve the tip's compliant resilient contacting capability despite its short length. Alternatively, a less rigid circuit board substrate could be employed in those cases where a more rigid tip is required, which would likewise provide compliance of the tip if a movable interconnecting structure between the board and tip is provided. A rigid extension 22a of the tip absorber 22, overlying a resilient rubber or other dielectric compression member 42, may also be provided to overlie the tip 14 at its forward extremity. As shown in FIG. 6, the compression member 42, upon contact of the tip with the device under test, forces the plane of the tip to conform to the plane of the device to insure proper contact.

Figure 2:
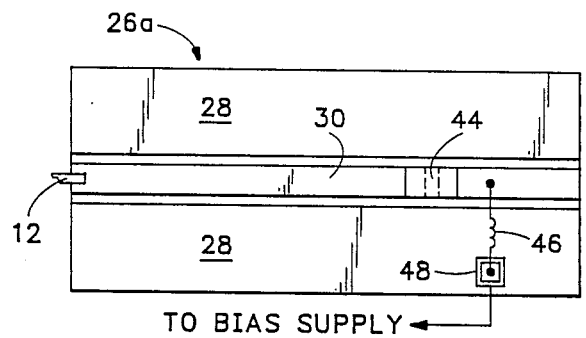
FIGS. 2 and 3 are enlarged top views of different exemplary embodiments of planar circuit boards which could be employed in the probe of FIG. 1.
Figure 3:
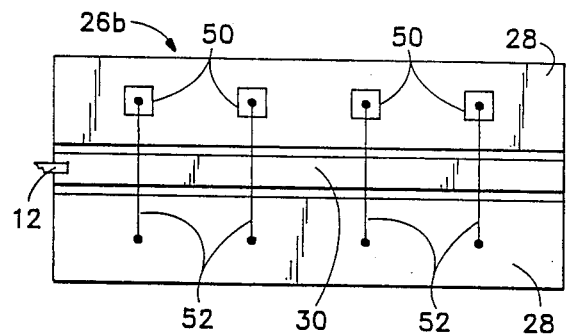

The advantage of having the planar circuit board 26 interposed between the connector assembly 12 and the detachable probe tip 14 is illustrated by the exemplary alternative embodiments of the circuit board shown in FIGS. 2 and 3. For example, in FIG. 2, circuit board 26a is equipped with a conventional bias tee assembly consisting of a capacitor 44 bridging a gap cut in the signal line 30, and an inductor 46 interconnecting the signal line 30 with a capacitor chip 48 mounted on a ground line 28 which, in turn, is connected to a bias supply. FIG. 3, on the other hand, shows an alternative circuit board 26b having a series of capacitors 50 interconnecting one ground line 28 with the other ground line through conductors 52, thereby enabling the ground lines 28 to function as low impedance power lines. Other passive or active electrical circuit components which could be incorporated into the circuit board include such elements as directional couplers, directional bridges, amplifiers, distributed microbolometers, varactor-loaded multiplier lines, tuned matching networks, Lange couplers, and so forth. These components could either be added to the circuit board or incorporated therein originally as part of a printed circuit. In any case, damage to the probe tip 14 requiring its replacement will not likewise require the replacement of such expensive passive and active electrical circuit components. Nevertheless, such components are mounted in extremely close proximity to the probe tip so that the benefits of minimized phase shift and low signal loss, normally obtainable only through direct mounting of such components on the probe tip, are obtained despite the absence of such direct mounting.

Figure 4A:
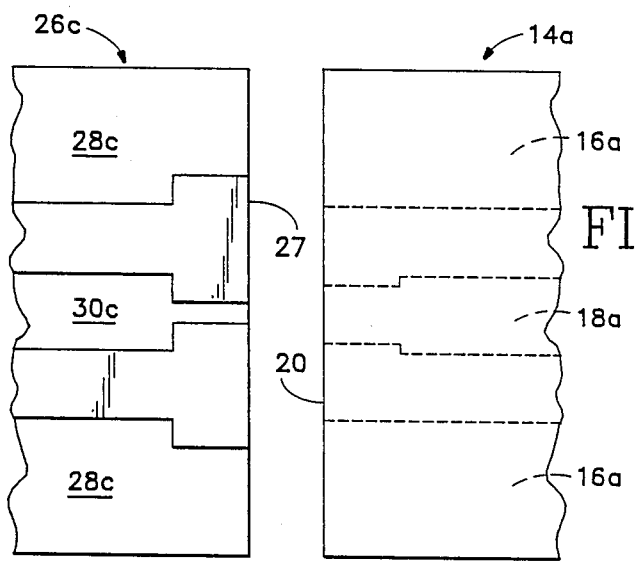
FIG. 4A is an enlarged top view of the interconnecting ends of a circuit board and replaceable probe tip, prior to their interconnection, showing an exemplary configuration which is tolerant to transverse misalignment of the two elements.
Figure 4B:
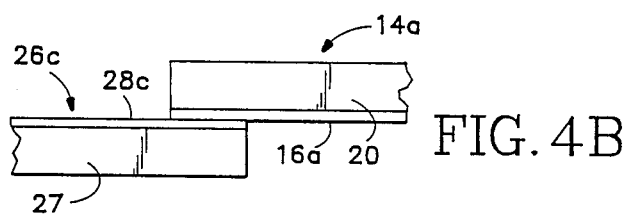
FIGS. 4B and 4C are side and top views, respectively, of the circuit board and probe tip of FIG. 4A in interconnected overlapping relationship.
Figure 4C:
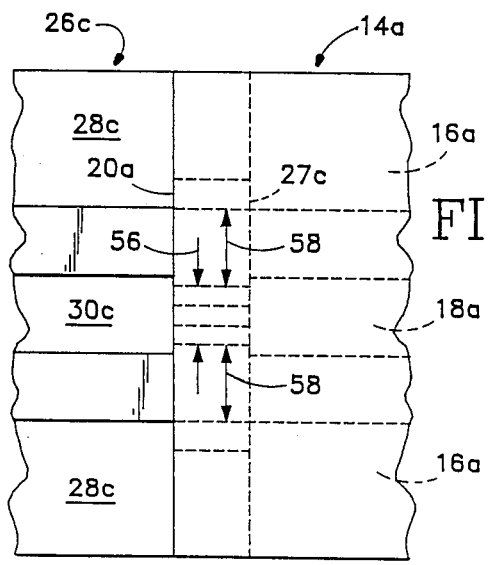

FIGS. 4A, 4B and 4C depict an exemplary configuration for the end portions of the conductive lines of a coplanar transmission line circuit board 26c and probe tip 14a which permit the circuit board and probe tip to be detachably interconnected in an overlapping fashion without causing any significant variation in the characteristic impedance of the overlapping interface even though the circuit board and probe tip may be transversely misaligned (i.e. misaligned in a direction transverse to their respective axes). Normally the overlapping end portions of corresponding conductors of joined coplanar transmission lines have identical transverse dimensions which, in the case of the signal lines, are somewhat reduced relative to the normal signal line width so as to reduce signal line-to-ground line capacitance at the overlapped interface. This normally compensates for the increase in capacitance at the interface caused by the longitudinal overlap of the two dielectric substrates, thereby maintaining the characteristic impedance of the transmission lines constant at the interface if the two transmission lines are not misaligned transversely or longitudinally. But, if transverse misalignment occurs, the overall transverse dimension of the overlapping end portions of the signal lines increases, while the transverse spaces between the overlapping signal line end portions and the overlapping ground line end portions decrease. Both of these changes in dimensions cause an increase in capacitance of the interface, which reduces the impedance thereof so that it no longer matches that of the interconnected transmission lines. However, the configurations of the end portions of the conductors shown in FIG. 4A are tolerant of transverse misalignment (but not longitudinal misalignment) of the probe tip and circuit board. This tolerance to transverse misalignment is achieved by the fact that each of the end portions of the ground and signal lines 16a, 18a of the probe tip has a respective transverse dimension which is greater than that of the corresponding end portion of the ground and signal lines 28c, 30c of the circuit board 26c. Thus, each of the end portions of the lines of the probe tip, when overlapping a narrower corresponding end portion of a line of the circuit board, has excess conductive material extending parallel to the plane of the probe tip beyond the conductive material of the narrower corresponding overlapped end portion. Therefore, if the probe tip and circuit board are transversely misaligned, the transverse dimension 56 (FIG. 4C) of the combined overlapped signal line end portions, and the transverse spaces 58 between the overlapped signal line end portions and the ground line end portions, remain constant within reasonable limits of misalignment. Accordingly, impedance variations at the interface of the probe tip and circuit board are minimized despite variations in transverse alignment thereof.

Figure 5A:
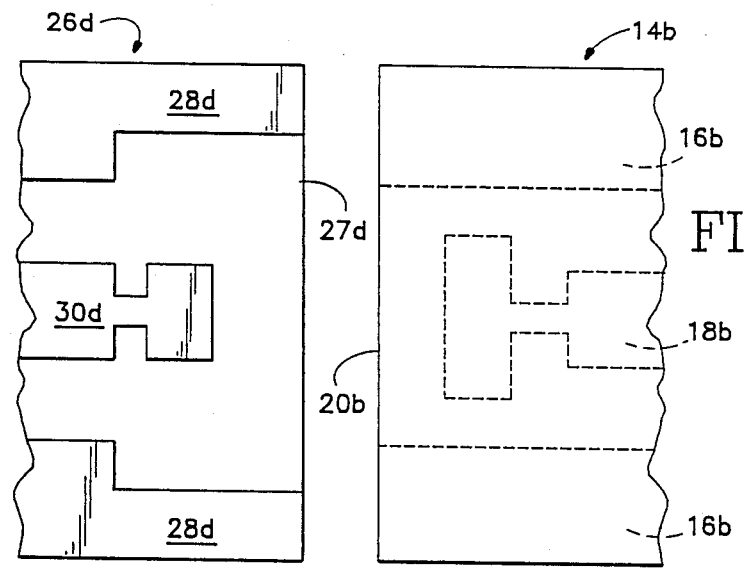
FIG. 5A is an enlarged top view of an alternative exemplary configuration of the interconnecting ends of the circuit board and probe tip, respectively, which is tolerant to both transverse and longitudinal misalignment.
Figure 5B:
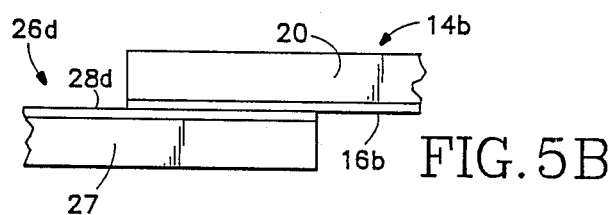
FIGS. 5B and 5C are side and top views, respectively, of the circuit board and probe tip of FIG. 5A in overlapping connected relationship.
Figure 5C:
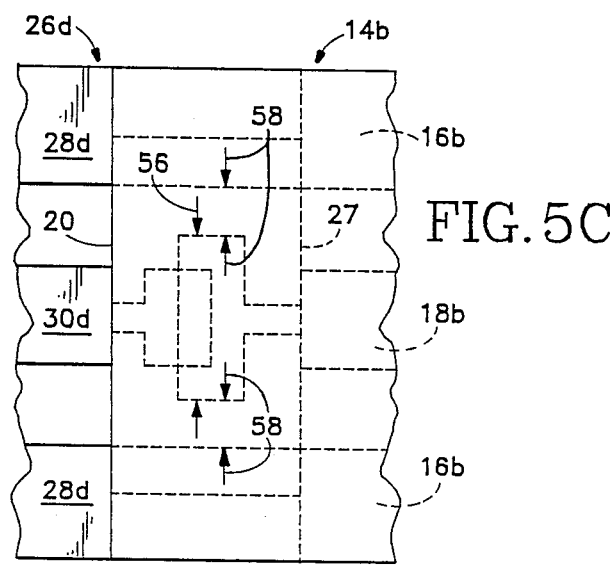

Longitudinal misalignment of the probe tip and circuit board can likewise cause a change in the impedance of the interface. Misalignment in a direction causing excessive longitudinal overlap increases the capacitance of the interface by increasing the overlap of the dielectric substrates, while insufficient longitudinal overlap decreases the capacitance (or increases the inductance) of the interface. Accordingly, FIG. 5A shows a further embodiment comprising a circuit board 26d and probe tip 14b which are effective to minimize variations in impedance resulting both from transverse and from longitudinal variations in alignment of the probe tip and circuit board. In this embodiment, each of the end portions of the ground lines 16b and signal line 18b of the probe tip 14b has a greater transverse dimension than the end portion of the corresponding line 28d, 30d of the circuit board 26d so as to minimize variations in impedance of the interface due to variations in transverse alignment in accordance with the principles of the embodiment of FIGS. 4A, 4B and 4C. The excess conductive material of the wider end portions of the probe tip lines keeps the transverse dimension 56 of the overlapped signal line end portions (FIG. 5C), and the transverse spaces 58 between the overlapped signal line end portions and the overlapped ground line end portions, constant despite variations in transverse alignment. Concurrently, each of the overlapping end portions of the signal lines has a transverse dimension which increases in magnitude in a direction toward the other transmission line, and each is foreshortened relative to its respective dielectric substrate 20 or 27, respectively. Consequently, their combined area parallel to the planes of the respective transmission lines and within the overlap of the dielectric substrates increases as the circuit board and probe tip are pulled apart, thereby increasing the capacitance between the signal line end portions and the ground line end portions to compensate for the decrease in capacitance which normally would result from pulling the probe tip and circuit board apart. A corresponding opposite compensation takes place if the probe tip and circuit board are pushed together The exact sizes and shapes of the geometric arrangements of the foregoing embodiments will vary with the characteristic impedance of the transmission lines and the dielectric constants of the respective overlapping substrates. Although the figures show the case of overlapping substrates having similar dielectric constants, such constants could be different. In general the structure most tolerant to longitudinal misalignment, and thus requiring the least geometric compensation, is one where the dielectric constants are minimized. Also, such geometric arrangements are equally applicable to planar transmission lines having different numbers of ground and signal lines. As used herein, the term "ground lines" encompasses comparable lines used for other purposes.

The term "wafer probe" as used herein is intended also to encompass probes employed for other purposes, such as probing IC packages, thin or thick film hybrid circuits, interconnect structures, chips, and other planar and non-planar devices.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A microwave wafer probe comprising:
   (a) a connector assembly for connecting said probe to an external first transmission line;
   (b) a planar probe tip comprising multiple planar conductors mounted on a dielectric substrate forming a second transmission line for detachably contacting a device under test;
   (c) a planar circuit board, interconnected operatively between said connector assembly and said probe tip, comprising multiple planar conductors mounted on a dielectric substrate forming a third transmission line for conducting signals between said connector assembly and said probe tip;
   (d) at least one electrical circuit component mounted on said circuit board in addition to said third transmission line; and
   (e) selectively releasable means detachably connecting said probe tip to said circuit board and detachably interconnecting said second and third transmission lines operatively.

2. The probe of claim 1 wherein said electrical circuit component includes at least one passive electrical circuit component in addition to said third transmission line.

3. The probe of claim 1 wherein said electrical circuit component includes at least one active electrical circuit component.

4. The probe of claim 1 wherein the dielectric substrate of said probe tip has a rigidity which is different from the rigidity of the dielectric substrate of said circuit board.

5. The probe of claim 1, further including resilient means for contacting said planar probe tip and forcing the plane of said tip to conform yieldably to said device under test when said tip contacts said device.

6. The probe of claim 1 wherein the multiple conductors of said probe tip and the multiple conductors of said circuit board, respectively, include interconnecting ends having dissimilar shapes for maintaining the impedance of the interface between said probe tip and said circuit board substantially constant despite changes in the positions of said probe tip and said circuit board with respect to each other.

7. The probe of claim 1 wherein the multiple conductors of said probe tip are coplanar and the multiple conductors of said circuit board are coplanar.

8. The probe of claim 7 wherein said selectively releasable means includes means for holding respective portions of the multiple conductors of said probe tip and respective portions of the multiple conductors of said circuit board in overlapping contacting relation to each other by releasably compressing them together in a direction normal to the planes of said conductors.

9. The probe of claim 8 wherein said respective portions of said multiple conductors include interconnecting ends having dissimilar shapes for maintaining the impedance of the interface between said probe tip and said circuit board substantially constant despite changes in the positions of said probe tip and said circuit board with respect to each other.

10. A microwave wafer probe comprising:
   (a) a connector assembly for connecting said probe to an external first transmission line;
   (b) a planar probe tip comprising multiple planar conductors mounted on a dielectric substrate forming a second transmission line for detachably contacting a device under test;
   (c) a planar circuit board, interconnected operatively between said connector assembly and said probe tip, comprising multiple planar conductors mounted on a dielectric substrate forming a third transmission line for conducting signals between said connector assembly and said probe tip;
   (d) said probe tip and said circuit board having respective controlled impedance coplanar transmission lines constituting said second and third transmission lines, respectively; and
   (e) selectively releasable means detachably connecting said probe tip to said circuit board and detachably interconnecting said second and third transmission lines operatively.

11. The probe of claim 10 wherein the multiple conductors of said probe tip and the multiple conductors of said circuit board, respectively, include interconnecting ends having dissimilar shapes for maintaining the impedance of the interface between said probe tip and said circuit board substantially constant despite changes in the positions of said probe tip and said circuit board with respect to each other.

12. The probe of claim 10 wherein said selectively releasable means includes means for holding respective portions of the multiple conductors of said probe tip and respective portions of the multiple conductors of said circuit board in overlapping contacting relation to each other by releasably compressing them together in a direction normal to the planes of said conductors.

* * * * *

UNITED STATES PATENT AND TRADEMARK OFFICE
CERTIFICATE OF CORRECTION

PATENT NO. : 4,849,689

DATED : July 18, 1989

INVENTOR(S) : K. Reed Gleason et al.

It is certified that error appears in the above-identified patent and that said Letters Patent is hereby corrected as shown below:

Col. 3, line 9  Change "Kaptonp 198" to --Kapton$^{TM}$--

Col. 5, line 55  Insert period after "together"

Signed and Sealed this

Tenth Day of December, 1991

Attest:

HARRY F. MANBECK, JR.

*Attesting Officer*   *Commissioner of Patents and Trademarks*